United States Patent
Tanaka et al.

(10) Patent No.: US 10,418,551 B2
(45) Date of Patent: Sep. 17, 2019

(54) SEMICONDUCTOR MEMORY DEVICE

(71) Applicant: Toshiba Memory Corporation, Minato-ku (JP)

(72) Inventors: Chika Tanaka, Fujisawa (JP); Kiwamu Sakuma, Yokkaichi (JP); Masumi Saitoh, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 145 days.

(21) Appl. No.: 15/391,039

(22) Filed: Dec. 27, 2016

(65) Prior Publication Data
US 2017/0271586 A1    Sep. 21, 2017

(30) Foreign Application Priority Data

Mar. 18, 2016 (JP) .................. 2016-056227

(51) Int. Cl.
*H01L 45/00* (2006.01)
*H01L 27/24* (2006.01)
*G11C 13/00* (2006.01)

(52) U.S. Cl.
CPC ...... *H01L 45/1233* (2013.01); *G11C 13/0023* (2013.01); *H01L 27/249* (2013.01); *H01L 27/2436* (2013.01); *H01L 27/2454* (2013.01); *G11C 13/0007* (2013.01); *G11C 2013/0083* (2013.01); *H01L 45/04* (2013.01); *H01L 45/1226* (2013.01); *H01L 45/146* (2013.01)

(58) Field of Classification Search
None
See application file for complete search history.

(56) References Cited

U.S. PATENT DOCUMENTS

| | | |
|---|---|---|
| 7,952,136 B2 | 5/2011 | Kito et al. |
| 8,036,010 B2 | 10/2011 | Maejima |
| 8,431,969 B2* | 4/2013 | Kim .................. H01L 27/0688 257/211 |
| 8,803,214 B2 | 8/2014 | Tang et al. |
| 9,029,938 B2 | 5/2015 | Nakaki |

(Continued)

FOREIGN PATENT DOCUMENTS

| | | |
|---|---|---|
| JP | 4709868 B2 | 3/2011 |
| JP | 5100080 B2 | 10/2012 |
| JP | 2013-153127 | 8/2013 |

(Continued)

*Primary Examiner* — Alexander G Ghyka
(74) *Attorney, Agent, or Firm* — Oblon, McClelland, Maier & Neustadt, L.L.P.

(57) ABSTRACT

A semiconductor memory device of an embodiment includes a memory cell array. The memory cell array comprises: a semiconductor layer extending in a first direction; a plurality of conductive layers that face a side surface of the semiconductor layer and are stacked in the first direction; a variable resistance film provided at an intersection of the semiconductor layer and one of the conductive layers; a plurality of contact parts provided at ends of the plurality of conductive layers in a second direction intersecting the first direction, respectively; and a plurality of conductive parts that extend in the first direction and are connected to the plurality of contact parts, respectively. At least one of the plurality of contact parts includes a projection part projecting in the second direction.

16 Claims, 9 Drawing Sheets

(56) References Cited

U.S. PATENT DOCUMENTS 9,673,389 B2 6/2017 Murooka
2014/0138597 A1* 5/2014 Nojiri ................ H01L 27/2454
257/2

FOREIGN PATENT DOCUMENTS

JP 2015-56452 A 3/2015
JP 2015-149503 8/2015

* cited by examiner

SEMICONDUCTOR MEMORY DEVICE

CROSS REFERENCE TO RELATED APPLICATION

This application is based upon and claims the benefit of priority from JP Patent Application No. 2016-56227, filed on Mar. 18, 2016, the entire contents of which are incorporated herein by reference.

FIELD

Embodiments described in the present specification generally relate to a semiconductor memory device.

BACKGROUND

In recent years, along with an increasingly high level of integration of a semiconductor memory device, an LSI element configuring the semiconductor memory device has been getting more and more miniaturized. A ReRAM (Resistive RAM) that utilizes as memory a variable resistance element whose resistance value is reversibly changed, has been proposed as this LSI element. The ReRAM includes a memory cell array in which the variable resistance element is provided at intersections of word lines that extend in a direction along a substrate surface and are stacked in a direction intersecting the substrate surface and bit lines that extend in the direction intersecting the substrate surface.

In the ReRAM, a bit line select transistor for driving the bit line is provided between the substrate and a lower end of the bit line. Moreover, in a conventional ReRAM, a word line select transistor for driving the word line was provided upwardly of the memory cell array. Therefore, formation of the bit line select transistor and formation of the word line select transistor ended up being separate steps.

Moreover, contrary to the case of the bit line select transistor connected to the lower end of the bit line, it was required to provide a lead-out wiring line connecting the word line and the word line select transistor.

Furthermore, in order to connect the lead-out wiring line and the word line, it was required to provide a terrace-shaped contact part at a word line end, and there was a problem that area of the contact part increased along with an increase in the number of layers of word lines stacked in the direction intersecting the substrate surface, leading to increasing size of the device.

DETAILED DESCRIPTION

A semiconductor memory device of an embodiment described below includes a memory cell array. The memory cell array comprises: a semiconductor layer extending in a first direction; a plurality of conductive layers that face a side surface of the semiconductor layer and are stacked in the first direction; a variable resistance film provided at an intersection of the semiconductor layer and one of the conductive layers; a plurality of contact parts provided at ends of the plurality of conductive layers in a second direction intersecting the first direction, respectively; and a plurality of conductive parts that extend in the first direction and are connected to the plurality of contact parts, respectively. At least one of the plurality of contact parts includes a projection part projecting in the second direction.

Semiconductor memory devices according to embodiments will be described in detail below with reference to the attached drawings. Moreover, each of the drawings of the semiconductor memory devices employed in the embodiments below is schematic, and thicknesses, widths, ratios, and so on, of layers are not necessarily identical to those of the actual semiconductor memory devices.

[First Embodiment]

Figure 1:
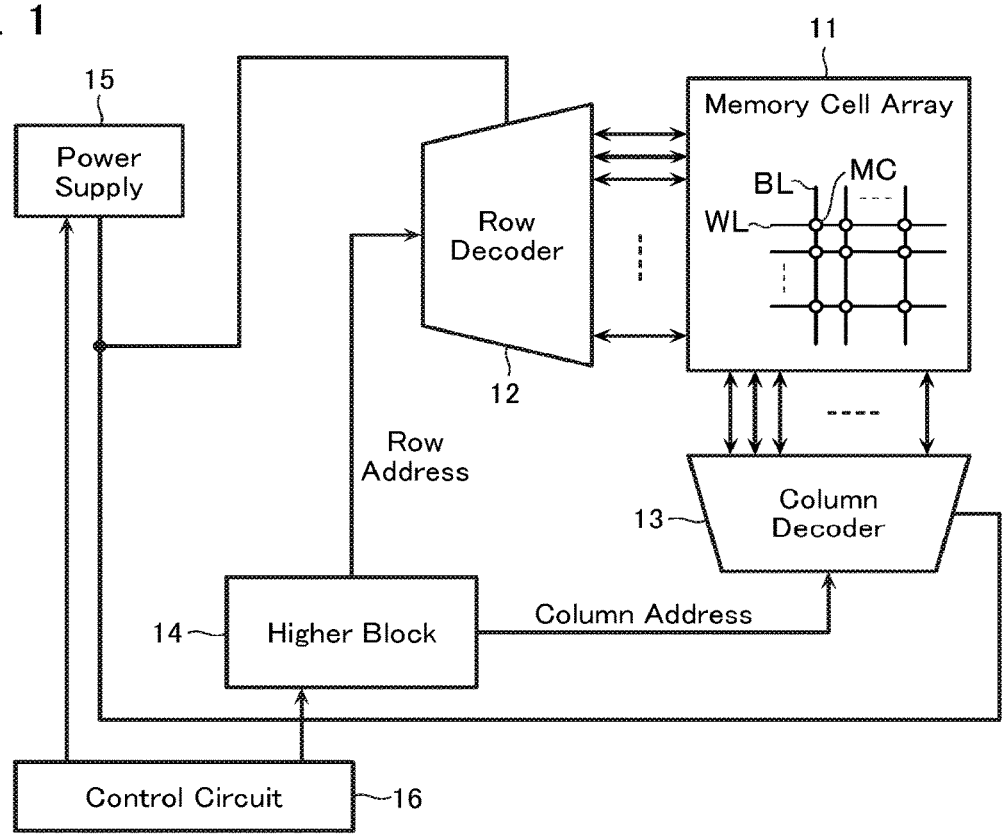
FIG. 1 is an example of a block diagram of a semiconductor memory device according to a first embodiment.

First, an overall configuration of a semiconductor memory device according to a first embodiment will be described. FIG. 1 is an example of a block diagram of the semiconductor memory device according to the first embodiment. As shown in FIG. 1, the semiconductor memory device includes: a memory cell array 11; a row decoder 12; a column decoder 13; a higher block 14; a power supply 15; and a control circuit 16.

The memory cell array 11 includes: a plurality of word lines WL and bit lines BL that intersect each other; and a memory cell MC disposed at each of intersections of these word lines WL and bit lines BL. The row decoder 12 selects the word line WL during access (data erase/write/read). The column decoder 13 selects the bit line BL during access, and includes a driver that controls an access operation.

The higher block 14 selects the memory cell MC which is to be an access target in the memory cell array 11. The higher block 14 provides a row address and a column address to, respectively, the row decoder 12 and the column decoder 13. The power supply 15 generates certain combinations of voltages corresponding to each of operations of data erase/write/read, and supplies these combinations of voltages to the row decoder 12 and the column decoder 13. The control circuit 16 performs control of the likes of sending the addresses to the higher block 14, and, moreover, performs control of the power supply 15, based on a command from external.

Figure 2:
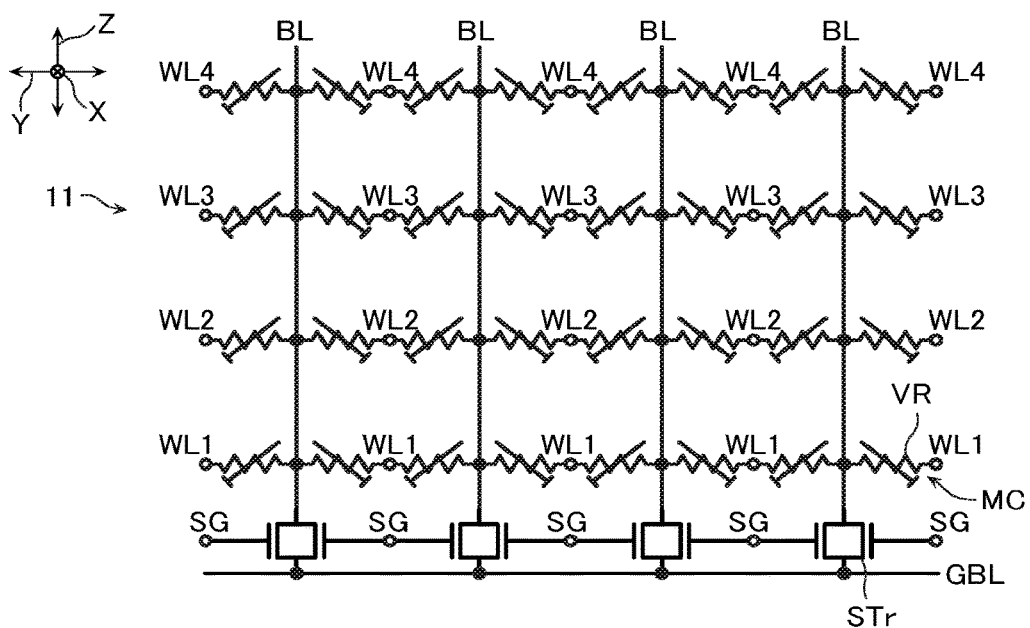
FIG. 2 is an example of an equivalent circuit diagram of a memory cell array 11 according to the first embodiment.
Figure 3:
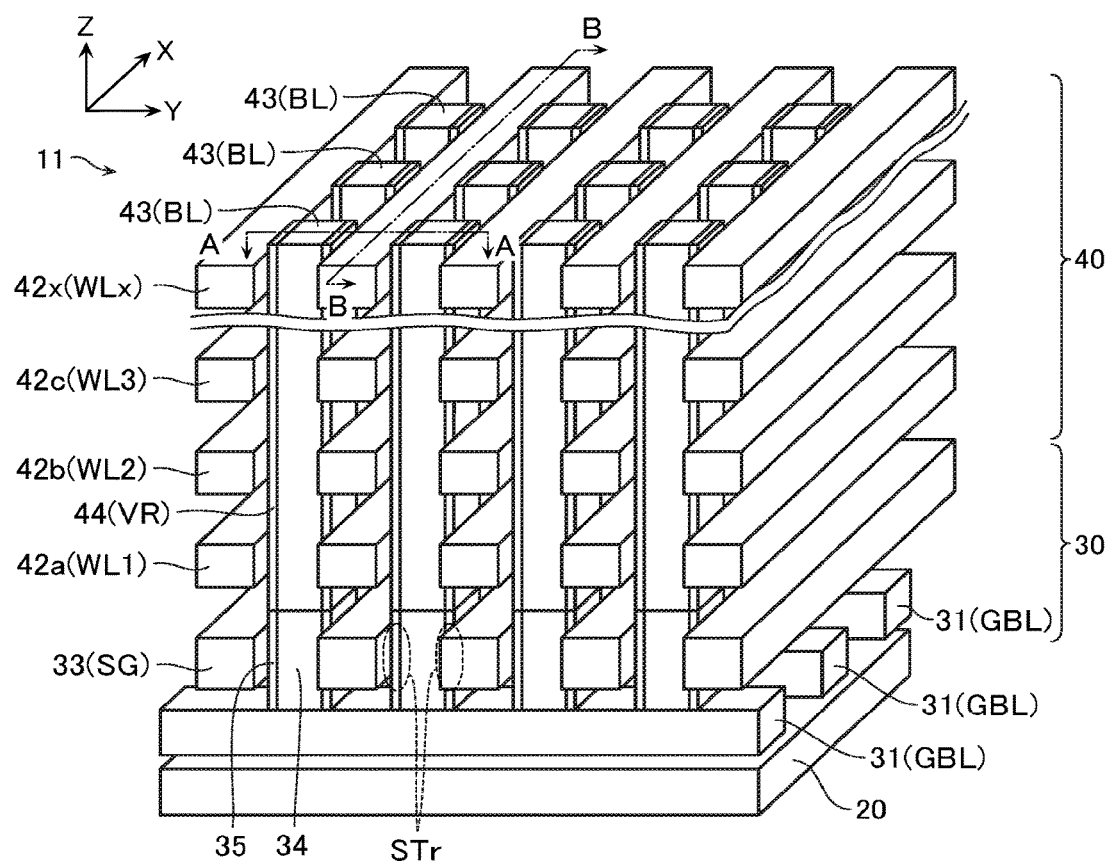
FIG. 3 is an example of a perspective view showing a structure of part of the memory cell array 11 included in the semiconductor memory device according to the first embodiment.

Next, the memory cell array 11 according to the first embodiment will be described in detail with reference to FIGS. 2 and 3. FIG. 2 is an example of a circuit diagram of the memory cell array 11. FIG. 3 is an example of a perspective view showing a stacked structure of the memory cell array 11. Note that in FIG. 2, an X direction, a Y direction, and a Z direction are orthogonal to each other, and the X direction is a direction perpendicular to a plane of paper. In addition, a structure shown in FIG. 2 is provided repeatedly in the X direction.

As shown in FIG. 2, the memory cell array 11 includes a select transistor STr, a global bit line GBL, and a select gate line SG, in addition to the above-mentioned word line WL, bit line BL, and memory cell MC.

As shown in FIGS. 2 and 3, word lines WL1-WL4 are arranged in the Z direction with a certain pitch, and extend in the X direction. The bit lines BL are arranged in a matrix in the X direction and the Y direction, and extend in the Z direction. The memory cells MC are disposed at places where these word lines WL and bit lines BL intersect. Therefore, the memory cells MC are arranged in a three-dimensional matrix in the X, Y, and Z directions. In various kinds of operations, a selected word line WL in the word lines WL1-WL4 can be applied with the same voltage regardless of its position in the Z direction. Moreover, an unselected word line WL in the word lines WL1-WL4 can be applied with the same voltage regardless of its position in the Z direction.

As shown in FIG. 2, the memory cell MC includes a variable resistance element VR. The variable resistance element VR is capable of being electrically rewritten and stores data in a nonvolatile manner based on a resistance value of the variable resistance element VR. The variable resistance element VR changes from a high-resistance state (reset state) to a low-resistance state (set state) by a setting operation that applies a certain voltage or more to both ends of the variable resistance element VR, and changes from the low-resistance state (set state) to the high-resistance state (reset state) by a resetting operation that applies a certain voltage or more to both ends of the variable resistance element VR. In addition, the variable resistance element VR immediately after manufacturing is in a state where its resistance state is not easily changed, and is in the high-resistance state. Accordingly, a forming operation is executed. In the forming operation, a high voltage greater than or equal to those of the setting operation and the resetting operation is applied to both ends of the variable resistance element VR. As a result of this forming operation, a region (filament path) where locally it is easy for a current to flow is formed in the variable resistance element VR, whereby the variable resistance element VR can have its resistance state changed easily, and achieves a state of being operable as a storage element.

As shown in FIG. 2, the select transistor STr is provided between the global bit line GBL and one end of the bit line BL. The global bit lines GBL are aligned with a certain pitch in the X direction, and extend in the Y direction. One global bit line GBL is commonly connected to one ends of a plurality of the select transistors STr arranged in a line in the Y direction. Moreover, gate electrodes of two select transistors STr arranged adjacently in the Y direction are commonly connected. The select gate lines SG are aligned with a certain pitch in the Y direction, and extend in the X direction. One select gate line SG is commonly connected to gates of a plurality of the select transistors STr arranged in a line in the X direction. Note that it is also possible to isolate the gate electrodes of two select transistors STr arranged adjacently in the Y direction and thereby operate each of the two select transistors STr independently.

Figure 4:
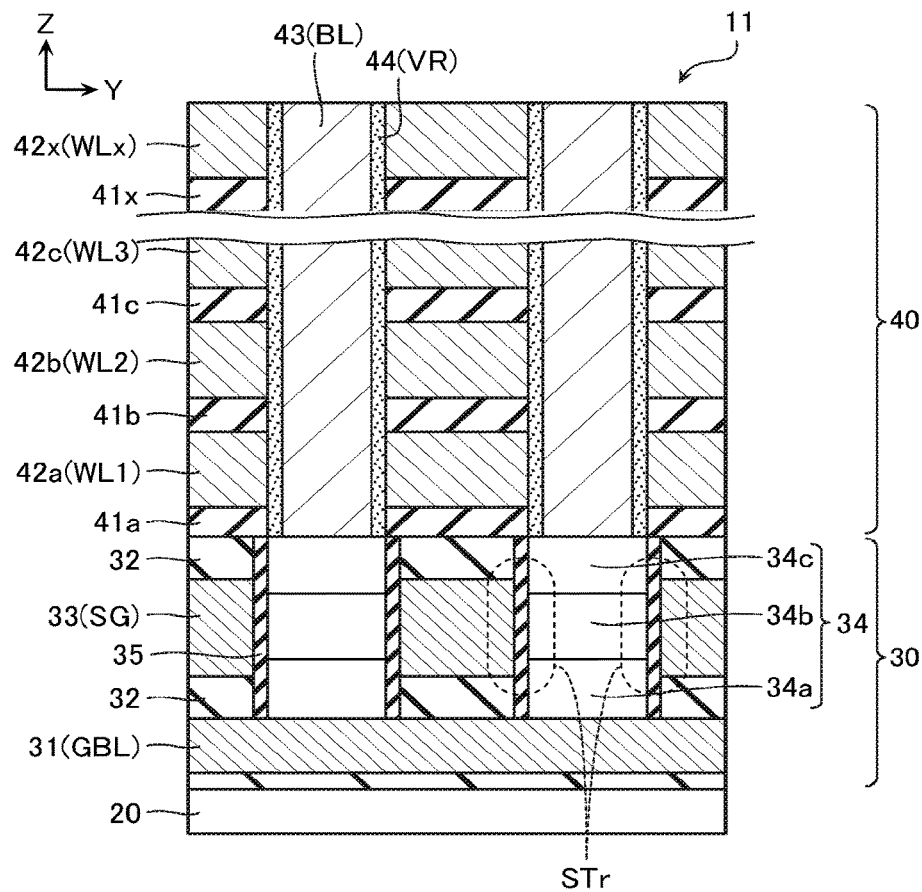
FIG. 4 is a Y-Z cross-sectional view, taken along the line A-A of FIG. 3, showing a configuration of part of the memory cell array 11 according to the first embodiment.
Figure 5:
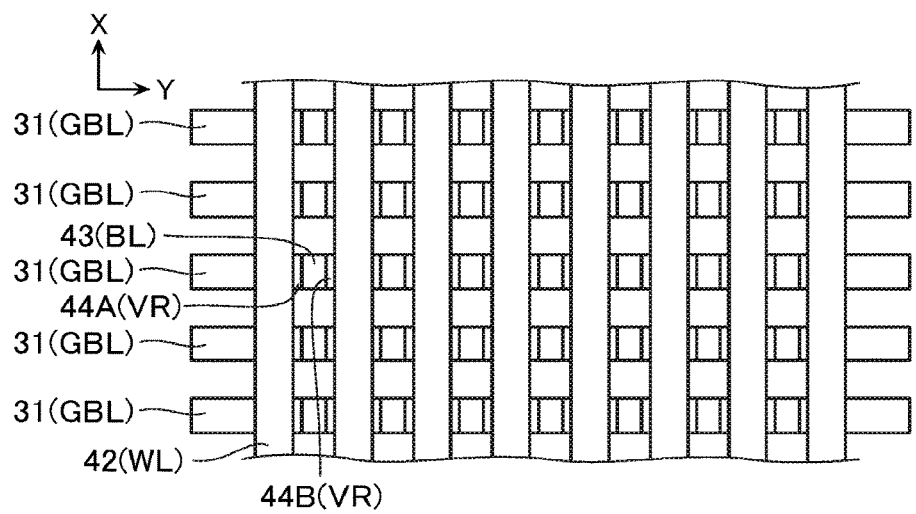
FIG. 5 is an X-Y cross-sectional view, taken along the line B-B of FIG. 3, showing a configuration of part of the same memory cell array 11.

Next, the stacked structure of the memory cell array 11 according to the first embodiment will be described with reference to FIGS. 3, 4, and 5. FIG. 4 is a view (Z-Y cross-sectional view) of the A-A plane of FIG. 3 seen from the X direction; and FIG. 5 is a top view of FIG. 3. Note that in FIGS. 3 and 5, an inter-layer insulating layer is omitted.

As shown in FIGS. 3 and 4, the memory cell array 11 includes a select transistor layer 30 and a memory layer 40 that are stacked on a substrate 20. The select transistor layer 30 includes the select transistor STr, and the memory layer 40 includes a plurality of the memory cells MC.

As shown in FIGS. 3 and 4, the select transistor layer 30 includes a conductive layer 31, an inter-layer insulating layer 32, and a conductive layer 33. These conductive layer 31, inter-layer insulating layer 32, and conductive layer 33 are stacked in the Z direction intersecting a substrate 20 surface. The conductive layer 31 functions as the global bit line GBL, and the conductive layer 33 functions as the select gate line SG and as a gate of the select transistor STr.

The conductive layers 31 are aligned with a certain pitch in the X direction parallel to the substrate 20, and extend in the Y direction (refer to FIG. 5). The inter-layer insulating layer 32 covers an upper surface of the conductive layer 31. The conductive layers 33 are aligned with a certain pitch in the Y direction, and extend in the X direction (refer to FIG. 5). For example, the conductive layers 31 and 33 are configured by polysilicon. The inter-layer insulating layer 32 is configured by silicon oxide ($SiO_2$).

In addition, as shown in FIGS. 3 and 4, the select transistor layer 30 includes a columnar semiconductor layer 34 and a gate insulating layer 35. The columnar semiconductor layer 34 functions as a body (channel) of the select transistor STr, and the gate insulating layer 35 functions as a gate insulating film of the select transistor STr.

The columnar semiconductor layers 34 extend in a column shape in the Z direction, and are disposed in a matrix along the X and Y directions. Moreover, the columnar semiconductor layer 34 contacts the upper surface of the conductive layer 31, and contacts a side surface in the Y direction of the conductive layer 33 via the gate insulating layer 35. Moreover, as shown in FIG. 4, the columnar semiconductor layer 34 includes an N+ type semiconductor layer 34a, a P+ type semiconductor layer 34b, and an N+ type semiconductor layer 34c that are stacked.

The N+ type semiconductor layer 34a contacts the inter-layer insulating layer 32 at a side surface in the Y direction of the N+ type semiconductor layer 34a. The P+ type semiconductor layer 34b contacts the side surface of the conductive layer 33 at a side surface in the Y direction of the P+ type semiconductor layer 34b. The N+ type semiconductor layer 34c contacts the inter-layer insulating layer 32 at a side surface in the Y direction of the N+ type semiconductor layer 34c. The N+ type semiconductor layers 34a and 34c are configured by polysilicon that has been implanted with an N+ type impurity, and the P+ type semiconductor layer 34b is configured by polysilicon that has been implanted with a P+ type impurity. The gate insulating layer 35 is configured by silicon oxide ($SiO_2$), for example.

As shown in FIGS. 3 and 4, the memory layer 40 includes inter-layer insulating layers 41a-41x and conductive layers 42a-42x that are stacked alternately in the Z direction. The conductive layers 42a-42x respectively function as word lines WL1-WLx. The conductive layers 42a-42x extend in the X direction, and are arranged along the Y direction (refer to FIG. 5). The inter-layer insulating layers 41a-41x are configured by silicon oxide (SiO$_2$), for example, and the conductive layers 42a-42x are configured by polysilicon, for example.

In addition, as shown in FIGS. 3 and 4, the memory layer 40 includes a columnar conductive layer 43 and a variable resistance layer 44. The columnar conductive layer 43 functions as the bit line BL. The variable resistance layer 44 functions as the variable resistance element VR.

The columnar conductive layers 43 are disposed in a matrix in the X and Y directions, contact upper surfaces of the columnar semiconductor layers 34, and extend in a column shape in the Z direction. The variable resistance layer 44 is provided between a side surface in the Y direction of the columnar conductive layer 43 and side surfaces in the Y direction of the inter-layer insulating layers 41a-41x. In addition, the variable resistance layer 44 is provided between the side surface in the Y direction of the columnar conductive layer 43 and side surfaces in the Y direction of the conductive layers 42a-42x. The columnar conductive layer 43 is configured by polysilicon, for example, and the variable resistance layer 44 is configured by, for example, a metal oxide (for example, HfO$_x$, Al$_2$O$_x$, TiO$_x$, NiO$_x$, WO$_x$, Ta$_2$O$_x$, and so on).

Figure 6A:
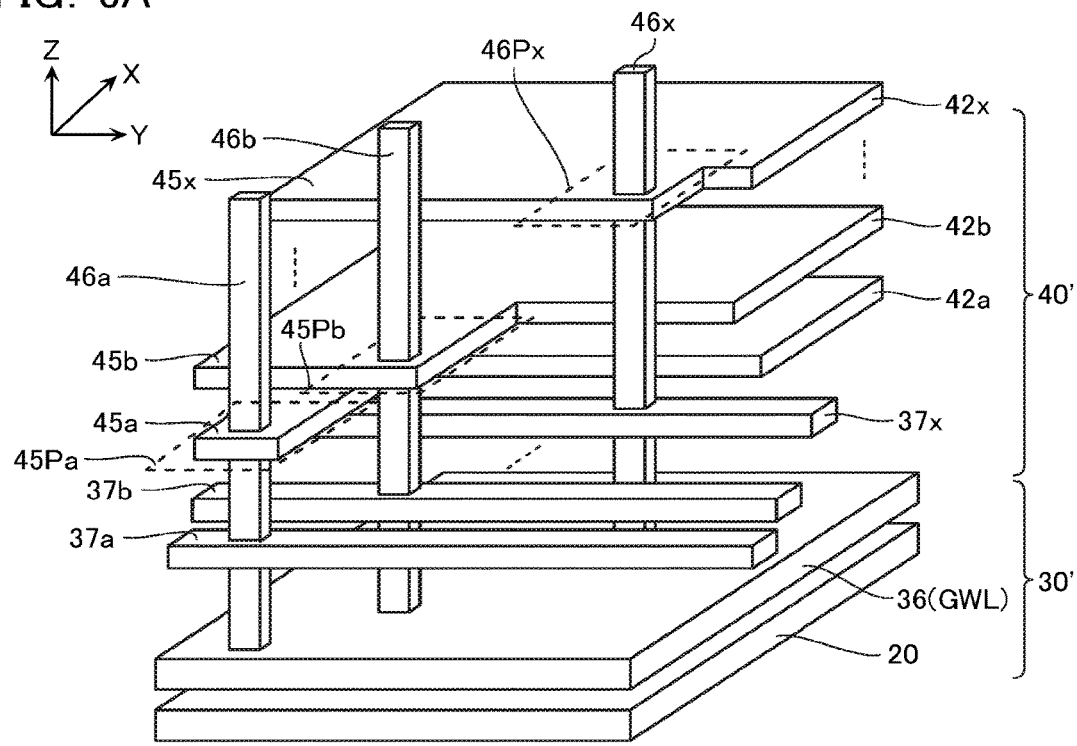
FIG. 6A is an example of a schematic perspective view showing a configuration of an end of a word line WL, of the semiconductor memory device according to the first embodiment.
Figure 6B:
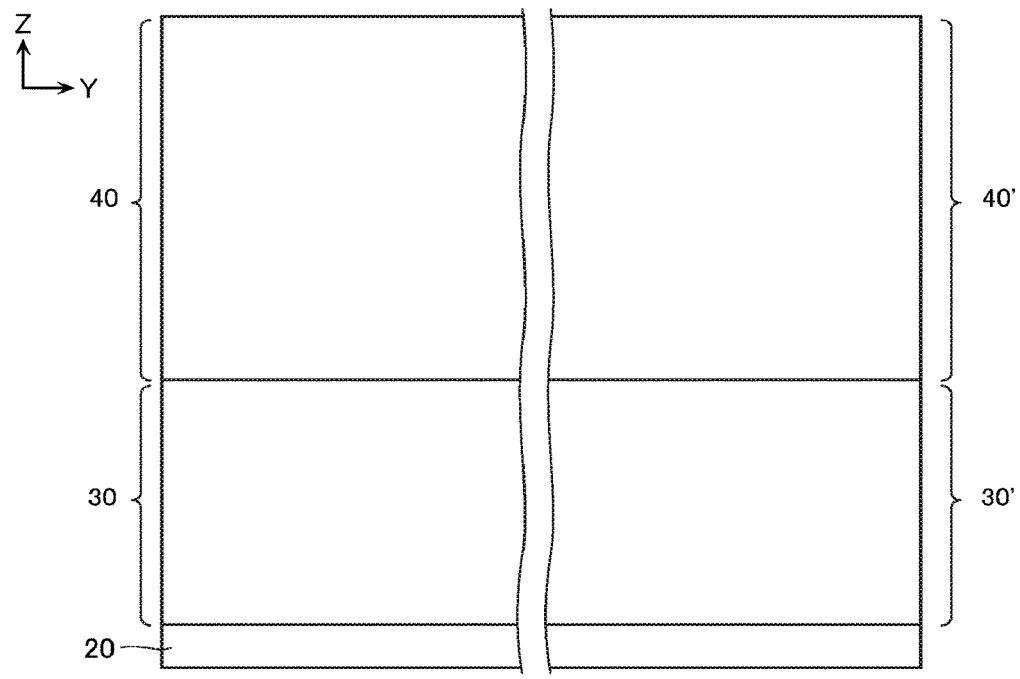
FIG. 6B is a conceptual view showing a configuration of part of the memory cell array 11 according to the first embodiment.
Figure 7:
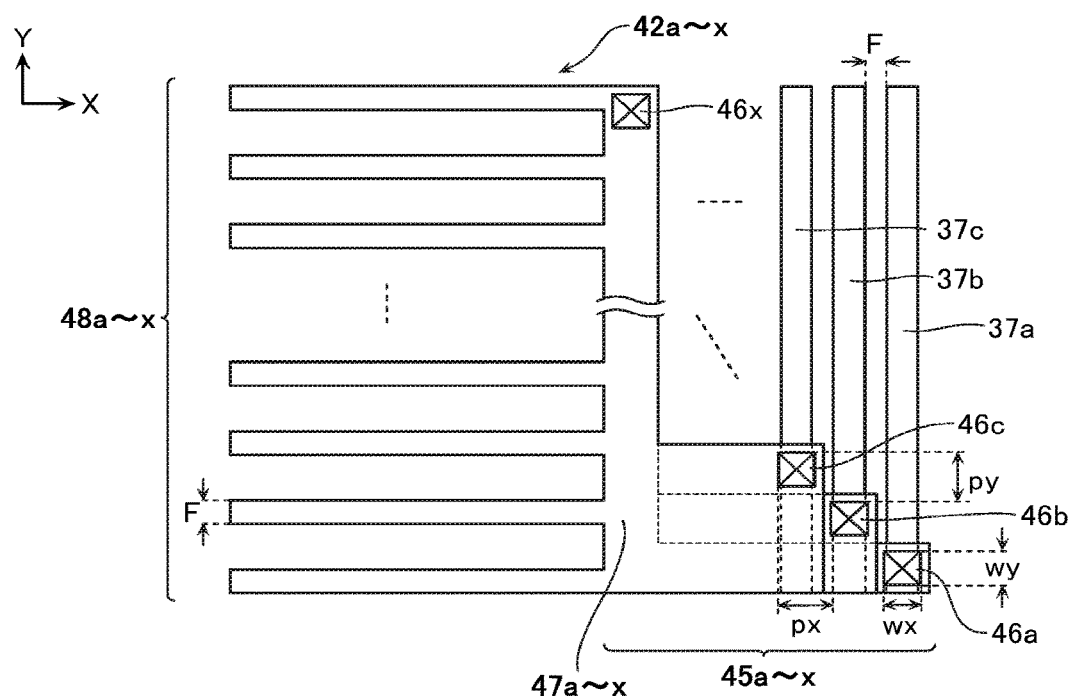
FIG. 7 is a top view of the end of the word line WL shown in FIG. 6A.
Figure 8:
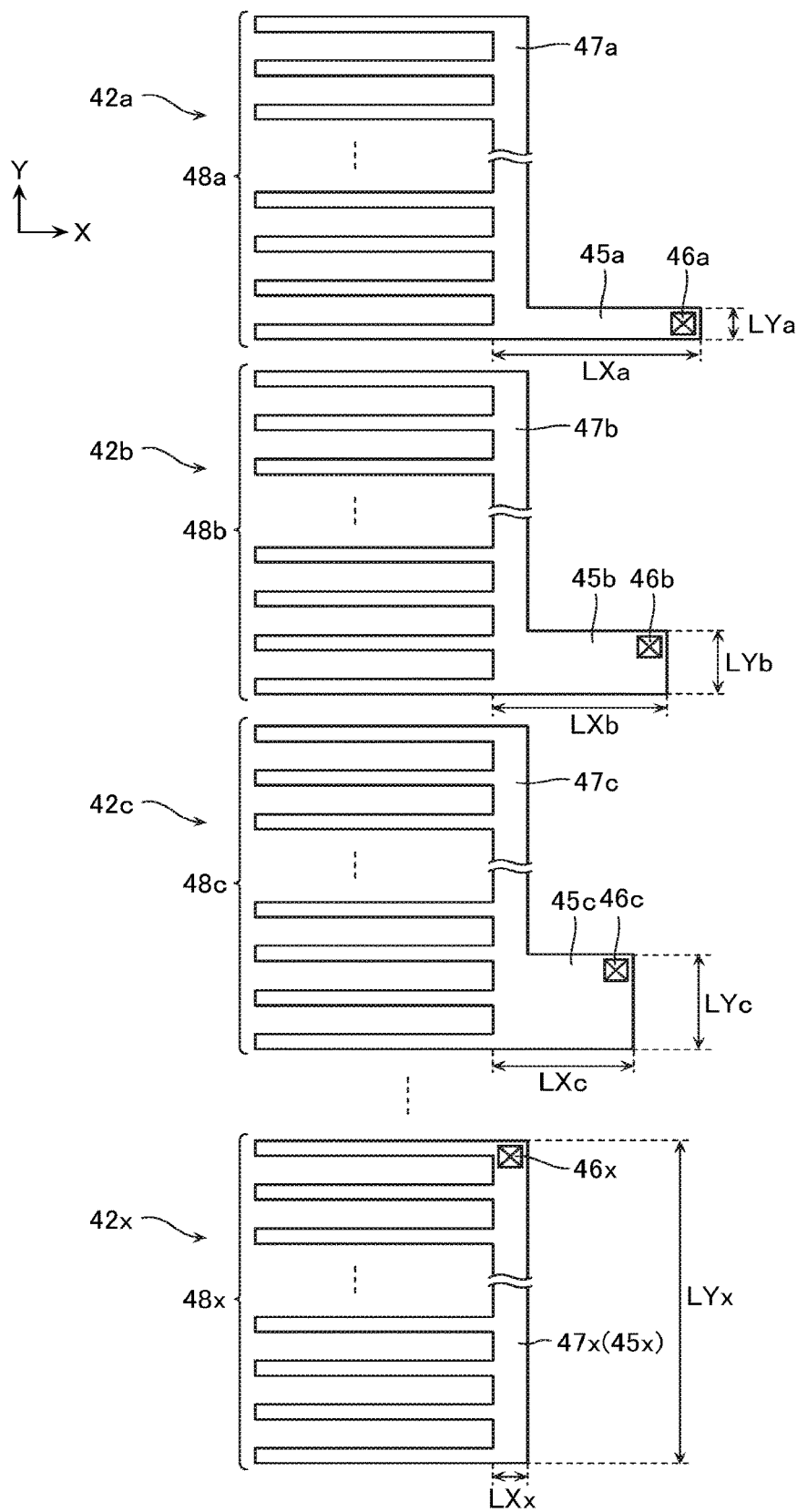
FIG. 8 is a plan view showing configurations of each of the word lines WL according to the first embodiment.

Next, a configuration of a contact part provided at an end of the word line WL, of the memory cell array 11 according to the present embodiment will be described with reference to FIGS. 6A through 8. FIG. 6A is a schematic perspective view showing a configuration of part including contact parts 45a-45x provided at ends on an X direction side of the conductive layers 42a-42x (word lines WL), of the memory cell array 11. FIG. 6B is a conceptual view showing a configuration of part of the memory cell array 11, and particularly shows a positional relationship of the select transistor layer 30 and a select transistor layer 30' and the memory layer 40 and a contact layer 40'. FIG. 7 is a top view showing the same configuration. FIG. 8 is a plan view showing configurations of each of the conductive layers 42a-42x (word lines WL).

As shown in FIG. 6A, the memory cell array 11 in the present embodiment includes the select transistor layer 30' and the contact layer 40' at the ends of the conductive layers 42a-42x. As shown in FIG. 6B, the select transistor layer 30' is provided in the same layer as the select transistor layer 30, on the substrate 20. The contact layer 40' is configured in the same layer as the memory layer 40.

As shown in FIG. 6A, the select transistor layer 30' includes a wiring line layer 36 and conductive layers 37a, 37b, . . . , 37x. The wiring line layer 36 is a global word line GWL provided along an X-Y plane, on the substrate 20, and functions as part of a driver driving the conductive layer 42 (word line WL). The conductive layers 37a-37x intersect later-described contact plugs (conductive parts) 46a-46x. An unshown select gate transistor is provided at intersections of the conductive layers 37a-37x and the contact plugs 46a-46x. That is, an unshown gate insulating film is disposed at the intersections of the conductive layers 37a-37x and the contact plugs 46a-46x. This gate insulating film, the contact plugs 46a-46x, and the conductive layers 37a-37x function as select gate transistors selectively driving the conductive layers 42a-42x (word lines WL). Moreover, the conductive layers 37a-37x function as select gate lines.

Note that as shown in FIG. 7, each of the conductive layers 42a-42x has a comb tooth shape configured from: bases 47a-47x; and a plurality of branches 48a-48x projecting from the bases 47a-47x. In other words, each of the conductive layers 42a-42x is configured from: a plurality of first portions (branches 48a-48x) that extend in the X direction and are arranged with a certain pitch along the Y direction; and a second portion (bases 47a-47x) that extends in the Y direction and is commonly connected to ends of the branches 48a-48x. Moreover, the bases 47a-47x configure part of the contact parts 45a-45x.

The conductive layers 37a-37x extend in the Y direction and are arranged in plurality along the X direction. The conductive layers 37a-37x are configured by the likes of polysilicon, for example. The contact plugs 46a-46x extend in the Z direction. The contact plugs 46a-46x are configured by the likes of polysilicon, for example. The unshown gate insulating layer disposed between the conductive layers 37a-37x and the contact plugs 46a-46x is configured from silicon oxide, for example.

As described above, in the present embodiment, the select transistor layer 30' that includes the global word line GWL configuring part of the driver driving the word line WL and the select transistor layer 30 that includes the global bit line GBL driving the bit line BL, are provided in the same layer. Therefore, the global word line GWL and the global bit line GBL can be formed in the same step. That is, it becomes possible for each of the transistors included in the select transistor layer 30 and each of the transistors included in the select transistor layer 30' to be formed at an identical timing, using an identical material. Therefore, simplification of manufacturing steps becomes possible.

Moreover, the global word line GWL and the global bit line GBL are provided more downwardly than the conductive layers 42a-42x. Therefore, the wiring line layer 36 and the global bit line GBL are formed before formation of the conductive layers 42a-42x. As a result, it can be prevented that excessive heat is applied to the likes of the conductive layers 42a-42x or memory cells MC by a thermal step at a time when the global word line GWL and the global bit line GBL are formed.

The contact layer 40' includes the contact parts 45a, 45b, . . . , 45x and the contact plugs 46a, 46b, . . . , 46x. The contact parts 45a-45x extend from the ends (bases 47a-47x) in the X direction of the conductive layers 42a-42x. The contact plugs 46a-46x have longitudinally the Z direction and penetrate the conductive layers 37a-37x and the contact parts 45a-45x. In addition, lower ends of the contact plugs 46a-46x are connected to the wiring line layer 36. As previously mentioned, the gate insulating layer is disposed between the conductive layers 37a-37x and the contact plugs 46a-46x.

In the present embodiment, as shown in FIGS. 6A and 7, in order that each of the contacts parts 45a-45x does not overlap any other of the contact parts 45a-45x as viewed from the Z direction, each of the contact parts 45a-45x includes projection parts 45Pa, 45Pb, . . . , 45Px projecting in the X direction or the Y direction.

For example, the lowermost layer contact part 45a includes the projection part 45Pa that by projecting more in the X direction than any other of the contact parts 45b-45x, is configured so as to not overlap the other contact parts 45b-45x. Moreover, the second from lowermost layer contact part 45b includes the projection part 45Pb that by projecting more in the Y direction than the lowermost layer contact part 45a and projecting more in the X direction than the contact parts 45c-45x of layers more upward than the contact part 45b, is configured so as to not overlap the other contact parts 45a and 45c-45x.

Moreover, in the present embodiment, the contact plugs 46a-46x are provided so as to penetrate these projection parts 45Pa-45Px. Therefore, as shown in FIG. 6A, none of the contact plugs 46a-46x, in a span that they are connected from above to the wiring line layer 36, makes contact with the contact parts 45a-45x other than the contact parts 45a-45x to which they are each supposed to be connected. Therefore, even in a structure where the wiring line layer 36 is disposed downwardly of the conductive layers 42a-42x, the contact plugs 46a-46x are prevented from being connected to a plurality of the contact parts 45a-45x, and a short circuit between the conductive layers 42a-42x can be suppressed.

Furthermore, it is possible to connect between the global word line GWL provided downwardly of the conductive layers 42a-42x and the conductive layers 42a-42x, by a wiring line of shortest distance. Therefore, an additional lead-out wiring line becomes unnecessary.

Shapes and so on of the contact parts 45a-45x provided in each of the conductive layers 42a-42x are not particularly limited provided they are set so as to include the projection parts 45Pa-45Px not overlapping the other contact parts 45a-45x. For example, as shown in FIG. 8, the contact parts 45a-45x in the present embodiment each have rectangular shapes whose widths in the X direction and widths in the Y direction are different. Making the widths in the X direction and the Y direction of the contact parts 45a-45x different in this way results in all of the contact parts 45a-45x being provided with a region not overlapping the other contact parts 45, that is, with the projection parts 45Pa-45Px.

In the present embodiment, pitches in the X direction and the Y direction that the contact plugs 46a-46x are arranged are, respectively, px and py. Moreover, as shown in FIG. 7, lengths in the X direction and the Y direction that the projection parts 45Pa-45Px project from the contact parts 45a-45x are configured substantially equal to, respectively, the pitch px and the pitch py.

On the other hand, as shown in FIG. 6A, the contact parts 45a-45x are stacked in order from 45a to 45x from bottom to top in the Z direction. Therefore, as shown in FIG. 8, lengths LXa-LXx in the X direction of the contact parts 45a-45x become smaller as layer heights of the contact parts 45a-45x increase. Moreover, a difference in length every one layer can be made substantially equal to the pitch px.

Moreover, lengths LYa-LYx in the Y direction of the contact parts 45a-45x become larger as layer heights of the contact parts 45a-45x increase. Moreover, a difference in length every one layer can be made substantially equal to the pitch py.

From the above, when n is assumed to be a natural number from a to x, a width LXn in the X direction of the contact part 45n is substantially equal to the pitch px in the X direction multiplied by (x+1−n). On the other hand, a width LYn in the Y direction of the contact part 45n is substantially equal to the pitch py in the Y direction multiplied by a layer number n.

The pitch px in the X direction with which the contact plugs 46a-46x are disposed must be at least substantially identical to or larger than a combined width of a width wx in the X direction of the contact plugs 46a-46x and a width F with which the likes of the branches 48a-48x of the conductive layers 42a-42x or the conductive layers 37a-37x are formed/disposed. Similarly, the pitch py in the Y direction with which the contact plugs 46a-46x are disposed must be substantially identical to or larger than a combined width of a width wy in the Y direction of the contact plugs 46a-46x and the width F with which the likes of the branches 48a-48x of the conductive layers 42a-42x or the conductive layers 37a-37x are formed/disposed.

The reason for setting the pitches px and py as described above is to prevent contact between the contact plugs 46a-46x and the contact parts 45a-45x to which the other contact plugs 46a-46x are connected (to prevent contact between the contact plugs 46a-46x and the contact parts 45a-45x to which they are not supposed to be connected).

[Advantages]

As described above, in the memory cell array 11 in the present embodiment, the contact plugs 46a-46x are provided so as to penetrate the projection parts 45Pa-45Px. Therefore, as shown in FIG. 6A, none of the contact plugs 46a-46x, in a span that they are connected from above to the wiring line layer 36, makes contact with the contact parts 45a-45x other than the contact parts 45a-45x to which they are each supposed to be connected. Therefore, even in a structure where the wiring line layer 36 is disposed downwardly of the conductive layers 42a-42x, the contact plugs 46a-46x are prevented from being connected to a plurality of the contact parts 45a-45x, and a short circuit between the conductive layers 42a-42x can be suppressed.

Note that although the above-described embodiment described the case where each of the contact parts 45a-45x respectively included the projection parts 45Pa-45Px, it is only required that at least one of each of the contact parts 45a-45x includes the projection parts 45Pa-45Px such as do not overlap the other contact parts 45a-45x. Furthermore, regarding the uppermost layer contact part 45x, it includes a portion such as does not overlap the other contact part 45, even if the projection parts 45Pa-45Px are not provided, hence there may be a configuration in which the contact part 45 other than the uppermost layer contact part 45x is provided with the projection part 45P.

[Second Embodiment]

A semiconductor memory device according to a second embodiment will be described using FIG. 9. In the semiconductor memory device according to the second embodiment, a configuration of a memory cell array 11 is identical to that of the above-described embodiment. Therefore, each of configurations will be assigned with the same symbols as in the above-described embodiment, and descriptions thereof will be omitted. The same applies also to later-described modified examples.

Figure 9:
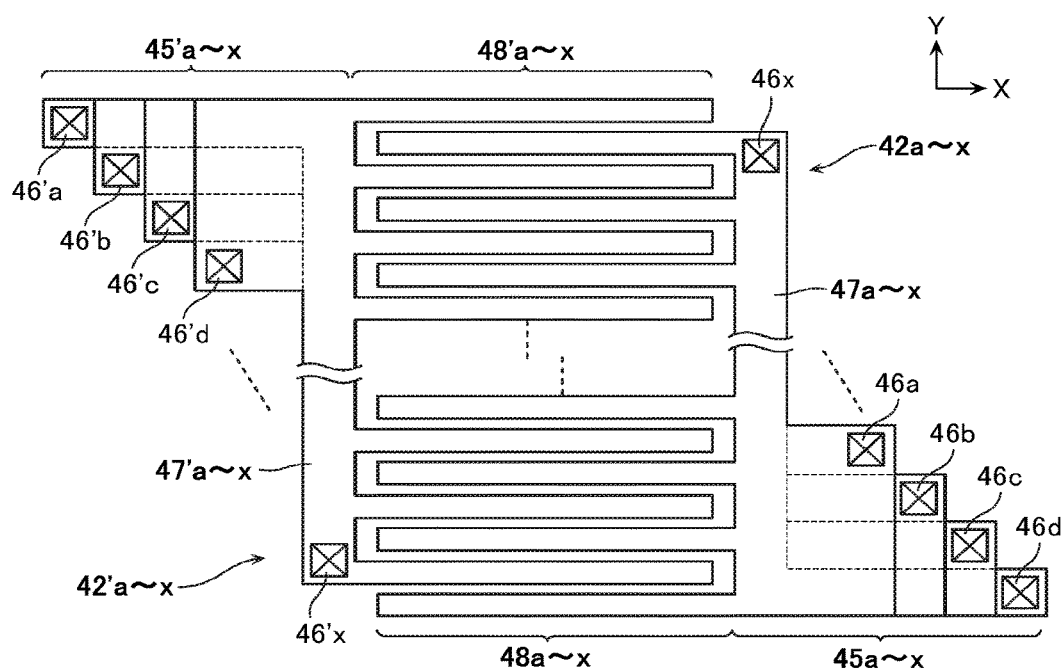
FIG. 9 is a plan view showing part of a configuration of a semiconductor memory device according to a second embodiment.

As shown in FIG. 9, in the semiconductor memory device according to the second embodiment, the conductive layers 42a-42x and a conductive layer 42' are arranged in parallel along the X direction such that mutual branches 48a-48x and 48'a-48'x are disposed alternately. Such a configuration also makes it possible for similar advantages to those of the above-described first embodiment to be displayed.

MODIFIED EXAMPLES

Semiconductor memory devices according to the modified examples will be described with reference to FIGS. 10 and 11.

First Modified Example

Figure 10:
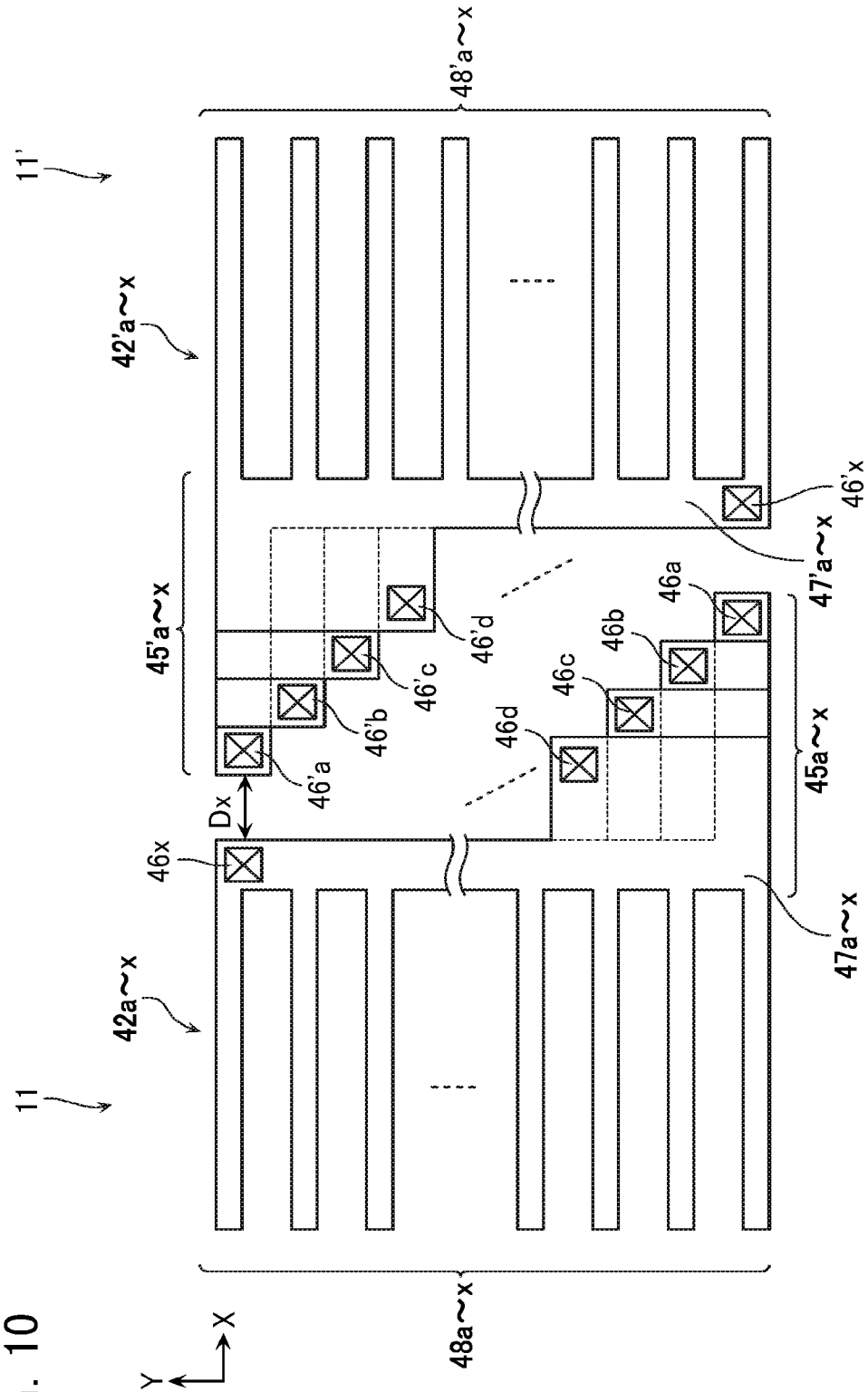
FIG. 10 shows a first modified example.

As shown in FIG. 10, in a semiconductor memory device according to a first modified example, a pair of memory cell arrays 11 and 11' are arranged in parallel along the X direction such that their contact parts 45a-45x and 45'a-45'x face each other.

Disposing the pair of memory cell arrays 11 and 11' in this way results in the contact parts 45a-45x of the memory cell array 11 facing the contact parts 45'x-45'a of the memory cell array 11' in the X direction. The lengths in the X direction of the contact parts 45a-45x become shorter as an upward Y direction is approached on a plane of paper of FIG. 9, and the lengths in the X direction of the contact parts 45'a-45'x become longer as the upward Y direction is approached. In other words, for example, the contact part 45a whose length in the X direction is longest in the memory cell array 11 faces in the X direction the contact part 45'x whose length in the X direction is shortest in the memory cell array 11'. Moreover, the contact part 45x whose length in the X direction is shortest in the memory cell array 11 faces in the X direction the contact part 45' a whose length in the X direction is longest in the memory cell array 11'.

Therefore, total lengths in the X direction of the contact parts 45a-45x and the contact parts 45'a-45'x are identical whatever a position in the Y direction. Moreover, distances Dx between the contact parts 45a-45x and the facing contact parts 45'x-45'a are identical whatever the position in the Y direction, and a wasted space never occurs. Therefore, an arrangement density of the memory cell array can be increased, and as a result, miniaturization of the device can be achieved.

Second Modified Example

Figure 11:
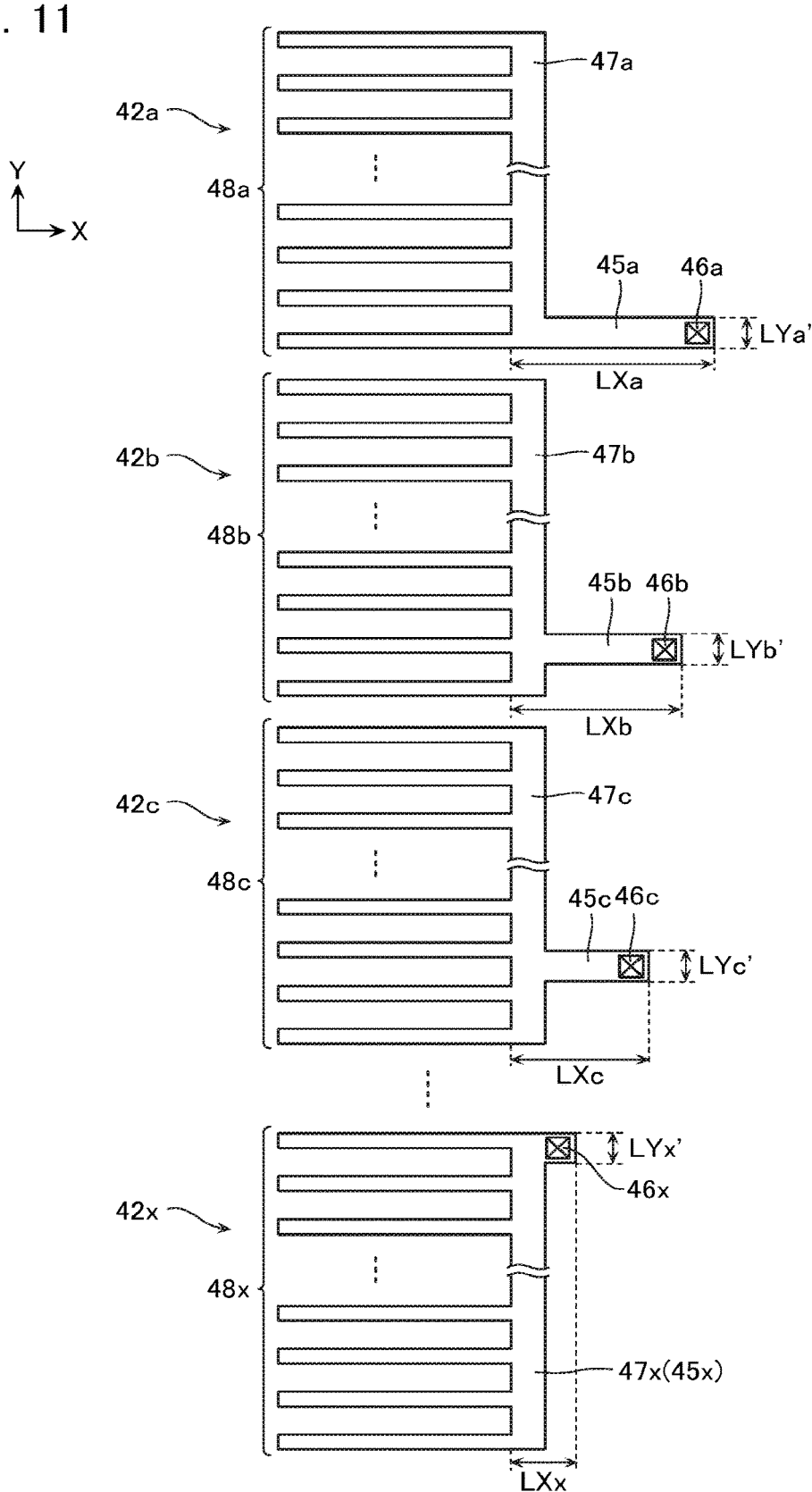
FIG. 11 shows a second modified example.

As shown in FIG. 11, in a semiconductor memory device according to a second modified example, the fact that the lengths LXa-LXx in the X direction of each of the contact parts 45 are different is similar to in the first embodiment. However, in the second modified example, the fact that lengths LYa'-LYx' in the Y direction of each of the contact parts 45a-45x are each substantively substantially identical is different from in the above-described embodiments.

Moreover, places where each of the contact parts 45a-45x are provided in the bases 47a-47x differ respectively in the Y direction, whereby each of the projection parts 46a-46x does not overlap the other contact parts 45a-45x looking in the Z direction. Therefore, similar advantages to those of the above-described embodiments are displayed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions. For example, in the above-described embodiments, the lengths in the X direction of the contact parts 45a-45x became longer and the lengths in the Y direction of the contact parts 45a-45x become shorter as the layer heights of the contact parts 45a-45x increased. However, when each of the contact parts 45a-45x is provided with the projection part, this order may also be reversed. That is, it is also possible for the lengths in the X direction of the contact parts 45a-45x to be configured shorter and for the lengths in the Y direction of the contact parts 45a-45x to be configured longer as the layer heights of the contact parts 45a-45x increase.

What is claimed is:

1. A semiconductor memory device, including a memory cell array that comprises:
a first conductive layer extending in a first direction;
a second conductive layer and a third conductive layer, each of the second conductive layer and the third conductive layer facing surfaces in a second direction of the first conductive layer, the second direction being intersecting with the first direction, the second conductive layer and the third conductive layer being arranged in the first direction;
a first variable resistance film provided between the first conductive layer and the second conductive layer;
a second variable resistance film provided between the first conductive layer and the third conductive layer;
a first contact plug extending in the first direction and connected to the second conductive layer; and
a second contact plug extending in the first direction and connected to the third conductive layer,
the second conductive layer including a first part and a second part, the first part being extending in a third direction and facing the first conductive layer, the second part being extending in the third direction and connected to the first contact plug, the third direction intersecting with the first direction and the second direction, the second part including a first end and a second end in the second direction, the second end being farther from an end in the second direction of the second conductive layer than the first end,
the third conductive layer including a third part and a fourth part, the third part being extending in the third direction and facing the first conductive layer, the fourth part being extending in the third direction and connected to the second contact plug, the fourth part including a third end and a fourth end in the second direction, the fourth end being farther from the end in the second direction of the second conductive layer than the third end,
positions in the third direction of the first contact plug and an end in the third direction of the second part of the second conductive layer being farther from the first conductive layer than positions in the third direction of the second contact plug and an end in the third direction of the fourth part of the third conductive layer, and
positions in the second direction of the first contact plug and the second end of the second part of the second conductive layer being nearer to the end in the second direction of the second conductive layer than positions in the second direction of the second contact plug and the fourth end of the fourth part of the third conductive layer.

2. The semiconductor memory device according to claim 1, wherein
the second conductive layer includes a fifth part extending in the second direction and connected to the first part and the second part, and
the third conductive layer includes a sixth part extending in the second direction and connected to the third part and the fourth part.

3. The semiconductor memory device according to claim 1, wherein
the end in the third direction of the second part of the second conductive layer is disposed so as to not overlap with the end in the third direction of the fourth part of the third conductive layer, as viewed from the first direction.

4. The semiconductor memory device according to claim 1, including
a substrate, wherein
the first direction is intersecting with a surface of the substrate,
the third conductive layer is farther from the substrate than the second conductive layer, a length in the third direction of the fourth part of the third conductive layer is smaller than a length in the third direction of the second part of the second conductive layer.

5. The semiconductor memory device according to claim 4, wherein
a difference in the lengths in the third direction of the fourth part of the third conductive layer and the second part of the second conductive layer is larger than a width in the third direction of the first contact plug.

6. The semiconductor memory device according to claim 1, including
a substrate, wherein
the first direction is intersecting with a surface of the substrate,
the third conductive layer is farther from the substrate than the second conductive layer,
a length in the second direction of the fourth part of the third conductive layer is larger than a length in the second direction of the second part of the second conductive layer.

7. The semiconductor memory device according to claim 6, wherein
a difference in the lengths in the second direction of the fourth part of the third conductive layer and the second part of the second conductive layer is larger than a width in the second direction of the first contact plug.

8. The semiconductor memory device according to claim 4, wherein
a length in the second direction of the fourth part of the third conductive layer is larger than a length in the second direction of the second part of the second conductive layer.

9. The semiconductor memory device according to claim 1, including
a fourth conductive layer,
a first semiconductor layer connected to an end in the first direction of the first contact plug and the fourth conductive layer, and
a first gate electrode facing the first semiconductor layer.

10. The semiconductor memory device according to claim 9, including
a second semiconductor layer connected to an end in the first direction of the second contact plug and the fourth conductive layer, and
a second gate electrode facing the second semiconductor layer.

11. The semiconductor memory device according to claim 9, including
a fifth conductive layer,
a third semiconductor layer connected to an end in the first direction of the first conductive layer and the fifth conductive layer, and
a third gate electrode facing the third semiconductor layer.

12. The semiconductor memory device according to claim 9, wherein
the first gate electrode extends in the second direction.

13. The semiconductor memory device according to claim 11, wherein
the first gate electrode extends in the second direction, and
the fifth conductive layer extends in the second direction.

14. The semiconductor memory device according to claim 1, wherein
the first variable resistance film is connected to the second variable resistance film.

15. The semiconductor memory device according to claim 1, wherein
a position in the second direction of the first end of the second part of the second conductive layer is nearer to the end in the second direction of the second conductive layer than a position in the second direction of the third end of the fourth part of the third conductive layer.

16. A semiconductor memory device, including
a memory cell array that comprises:
a first conductive layer extending in a first direction;
a second conductive layer and a third conductive layer, each of the second conductive layer and the third conductive layer facing surfaces in a second direction of the first conductive layer, the second direction being intersecting with the first direction, the second conductive layer and the third conductive layer being arranged in the first direction;
a first variable resistance film provided between the first conductive layer and the second conductive layer;
a second variable resistance film provided between the first conductive layer and the third conductive layer;
a first contact plug extending in the first direction and connected to the second conductive layer; and
a second contact plug extending in the first direction and connected to the third conductive layer,
the second conductive layer including a first part and a second part, the first part being extending in a third direction and facing the first conductive layer, the second part being extending in the third direction and connected to the first contact plug, the third direction being intersecting with the first direction and the second direction, the second part including a first end and a second end in the second direction, the second end being farther from an end in the second direction of the second conductive layer than the first end,
the third conductive layer including a third part and a fourth part, the third part being extending in the third direction and facing the first conductive layer, the fourth part being extending in the third direction and connected to the second contact plug, the fourth part including a third end and a fourth end in the second direction, the fourth end being farther from the end in the second direction of the second conductive layer than the third end,
a position in the third direction of an end in the third direction of the second part of the second conductive layer being farther from the first conductive layer than a position in the third direction of an end in the third direction of the fourth part of the third conductive layer, and
a position in the second direction of the second end of the second part of the second conductive layer being nearer to the end in the second direction of the second conductive layer than a position in the second direction of the fourth end of the fourth part of the third conductive layer.

* * * * *